United States Patent
Suh et al.

(10) Patent No.: US 12,374,673 B2
(45) Date of Patent: Jul. 29, 2025

(54) DISPLAY MODULE AND MANUFACTURING METHOD AS THE SAME

(71) Applicant: SAMSUNG ELECTRONICS CO., LTD., Suwon-si (KR)

(72) Inventors: Jenghun Suh, Suwon-si (KR); Dai Aoki, Yokohama (JP); Sungtae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 17/877,238

(22) Filed: Jul. 29, 2022

(65) Prior Publication Data
US 2022/0367434 A1 Nov. 17, 2022

Related U.S. Application Data

(63) Continuation of application No. PCT/KR2022/001225, filed on Jan. 24, 2022.

(30) Foreign Application Priority Data

Feb. 2, 2021 (KR) .................... 10-2021-0014860

(51) Int. Cl.
*H01L 25/16* (2023.01)
*H01L 23/00* (2006.01)
(Continued)

(52) U.S. Cl.
CPC ....... *H01L 25/167* (2013.01); *H10H 20/8512* (2025.01); *H01L 24/05* (2013.01);
(Continued)

(58) Field of Classification Search
CPC ..... H01L 25/167; H01L 33/502; H01L 24/05; H01L 24/29; H01L 24/32; H01L 24/83;
(Continued)

(56) References Cited

U.S. PATENT DOCUMENTS 6,515,312 B1 * 2/2003 Chen .................... H10K 50/841
264/272.17
8,014,071 B2 9/2011 Matsumoto et al.
(Continued)

FOREIGN PATENT DOCUMENTS

KR 10-2009-0103870 A 10/2009
KR 1020100037571 A 4/2010
(Continued)

OTHER PUBLICATIONS

International Search Report (PCT/ISA/210) and Written Opinion (PCT/ISA/237) dated May 19, 2022 issued by the International Searching Authority in International Application No. PCT/KR2022/001225.
(Continued)

*Primary Examiner* — Jonathan Han
(74) *Attorney, Agent, or Firm* — Sughrue Mion, PLLC

(57) ABSTRACT

A display module is disclosed. The display module includes a pixel that includes: first to third self-luminescence elements that are configured to emit light of an ultraviolet wavelength range; first to third color conversion layers respectively corresponding to light emitting surfaces of the first to third self-luminescence elements; a first color filter and a second color filter respectively corresponding to the first color conversion layer and the second color conversion layer; a transparent resin layer corresponding to the third color conversion layer and disposed on a same plane as a plane at which the first color filter and the second color filter are positioned; a transparent cover layer that covers the first color filter, the second color filter, and the transparent resin layer; and an ultraviolet (UV) cutoff filter that covers the transparent cover layer.

17 Claims, 12 Drawing Sheets

(51) Int. Cl.
    *H10H 20/01* (2025.01)
    *H10H 20/851* (2025.01)
    *H10H 20/854* (2025.01)
(52) U.S. Cl.
    CPC .............. *H01L 24/29* (2013.01); *H01L 24/32* (2013.01); *H01L 24/83* (2013.01); *H01L 2224/05573* (2013.01); *H01L 2224/05617* (2013.01); *H01L 2224/05624* (2013.01); *H01L 2224/05639* (2013.01); *H01L 2224/05644* (2013.01); *H01L 2224/05655* (2013.01); *H01L 2224/05664* (2013.01); *H01L 2224/05666* (2013.01); *H01L 2224/05671* (2013.01); *H01L 2224/2929* (2013.01); *H01L 2224/2939* (2013.01); *H01L 2224/29444* (2013.01); *H01L 2224/29455* (2013.01); *H01L 2224/29464* (2013.01); *H01L 2224/32145* (2013.01); *H01L 2224/83203* (2013.01); *H01L 2224/83851* (2013.01); *H01L 2924/01032* (2013.01); *H01L 2924/0635* (2013.01); *H01L 2924/0665* (2013.01); *H01L 2924/069* (2013.01); *H01L 2924/12041* (2013.01); *H10H 20/0361* (2025.01); *H10H 20/0362* (2025.01); *H10H 20/854* (2025.01)

(58) Field of Classification Search
    CPC ........... H01L 33/56; H01L 2224/05573; H01L 2224/05617; H01L 2224/05624; H01L 2224/05639; H01L 2224/05644; H01L 2224/05655; H01L 2224/05664; H01L 2224/05666; H01L 2224/05671; H01L 2224/2929; H01L 2224/2939; H01L 2224/29444; H01L 2224/29455; H01L 2224/29464; H01L 2224/32145; H01L 2224/83203; H01L 2224/83851; H01L 2924/01032; H01L 2924/0635; H01L 2924/0665; H01L 2924/069; H01L 2924/12041; H01L 2933/0041; H01L 2933/005; H01L 33/60; H01L 2933/0033; H01L 25/0753; H01L 24/26; H01L 33/505; H01L 27/156; B82Y 20/00; C09K 11/66; C09K 11/77; C09K 11/663; C09K 11/7734; C09K 11/77348; G02B 1/02; G02B 5/20; G02B 6/00; G02B 5/206; G02B 5/208; G02B 6/0026; G02B 2207/101; H10H 20/8512; H10H 20/0361; H10H 20/0362; H10H 20/854; H10H 20/036; H10H 20/856; H10H 20/8514; H10H 29/142
    See application file for complete search history.

(56) References Cited

U.S. PATENT DOCUMENTS

| | | | |
|---|---|---|---|
| 9,935,153 | B1 | 4/2018 | Jung et al. |
| 10,861,906 | B2 | 12/2020 | Park et al. |
| 11,121,171 | B2 | 9/2021 | Choi et al. |
| 2008/0165421 | A1* | 7/2008 | Matsumoto ............ G02B 5/283 359/589 |
| 2011/0260192 | A1 | 10/2011 | Kwak et al. |
| 2018/0006200 | A1* | 1/2018 | Morizumi ............. H01L 33/505 |
| 2019/0295996 | A1* | 9/2019 | Park ...................... H01L 33/502 |
| 2020/0098952 | A1* | 3/2020 | Kajiyama ................. G09F 9/33 |
| 2020/0373350 | A1 | 11/2020 | Kajiyama et al. |
| 2021/0118855 | A1* | 4/2021 | Kusunoki ............. H01L 25/167 |
| 2021/0273142 | A1* | 9/2021 | Kang ..................... H01L 33/62 |
| 2021/0399181 | A9 | 12/2021 | Kang et al. |
| 2022/0238759 | A1 | 7/2022 | Choi et al. |

FOREIGN PATENT DOCUMENTS

| | | | |
|---|---|---|---|
| KR | 10-2018-0063687 | A | 6/2018 |
| KR | 1020180081378 | A | 7/2018 |
| KR | 10-1947643 | B1 | 2/2019 |
| KR | 1020200001649 | A | 1/2020 |
| KR | 1020200014799 | A | 2/2020 |
| KR | 10-2020-0026677 | A | 3/2020 |
| KR | 1020200033846 | A | 3/2020 |
| KR | 10-2020-0062863 | A | 6/2020 |
| KR | 102125837 | B1 | 6/2020 |
| KR | 102146549 | B1 | 8/2020 |
| KR | 10-2020-0121313 | A | 10/2020 |
| KR | 1020210009326 | A | 1/2021 |

OTHER PUBLICATIONS

Communication issued Jan. 21, 2025 by the Korean Intellectual Property Office in counterpart Korean Patent Application No. 10-2021-0014860.

* cited by examiner

DISPLAY MODULE AND MANUFACTURING METHOD AS THE SAME

CROSS-REFERENCE TO THE RELATED APPLICATION

This application is a bypass continuation of International Application No. PCT/KR2022/001225, filed on Jan. 24, 2022, which is based on and claims the benefit of Korean Patent Application No. 10-2021-0014860, filed on Feb. 2, 2021, in the Korean Intellectual Property Office, the disclosures of each of which are incorporated by reference herein in their entireties.

BACKGROUND

1. Field

Embodiments of the present disclosure relate to a display module configured to use a self-luminescence element for displaying an image and a manufacturing method thereof.

2. Description of Related Art

An image may be displayed without backlight when using a self-luminescence element for displaying an image in a display panel. The display may express a variety of colors while being operated in a pixel or sub pixel unit formed of self-luminescence elements. Respective pixels or sub pixels may be controlled in operation by a thin film transistor (TFT).

Display panels of the related art, which use self-luminescence elements, are configured such that a color distribution is present due to a dispersion of emission wavelength between the self-luminescence elements and, when there is a temperature increase, efficiency of a red self-luminescence element is greatly reduced compared to a green self-luminescence element and a blue self-luminescence element, Also, the display panels of the related art have a problem of color temperature which is determined by a RGB contrast ratio changing.

SUMMARY

To solve this problem, the display panel of the related art has been developed to a display panel which includes a color conversion layer that uses the blue self-luminescence element and light emitted from the blue self-luminescence element as excitation light.

However, when using the blue self-luminescence element as an excitation light, color distribution of the red and green sub pixels may be improved but there is the problem of the color distribution of the blue sub pixel not improving.

Aspects of the disclosure address at least the above-mentioned problems and/or disadvantages and to provide at least the advantages described below. Accordingly, an aspect of the disclosure is to provide a display module which may improve all color distributions of a red, green, and blue sub pixels in a self-luminescence element and a manufacturing method thereof.

According to embodiments, a display module is provided. The display module includes: a substrate; and a plurality of pixels arranged on the substrate. Each pixel of the plurality of pixels includes: a first self-luminescence element, a second self-luminescence element, and a third self-luminescence element that are configured to emit light of an ultraviolet wavelength range; a first color conversion layer, a second color conversion layer, and a third color conversion layer respectively corresponding to light emitting surfaces of the first self-luminescence element, the second self-luminescence element, and the third self-luminescence element; a first color filter and a second color filter respectively corresponding to the first color conversion layer and the second color conversion layer; a transparent resin layer corresponding to the third color conversion layer and disposed on a same plane as a plane at which the first color filter and the second color filter are positioned; a transparent cover layer that covers the first color filter, the second color filter, and the transparent resin layer; and an ultraviolet (UV) cutoff filter that covers the transparent cover layer, wherein areas of surfaces of the first color conversion layer, the second color conversion layer, and the third color conversion layer, that respectively face in a first direction toward the light emitting surfaces of the first self-luminescence element, the second self-luminescence element, and the third self-luminescence element, are respectively greater than areas of the light emitting surfaces of the first self-luminescence element, the second self-luminescence element, and the third self-luminescence element.

According to one or more embodiments, the first self-luminescence element, the second self-luminescence element, and the third self-luminescence element are separated from each other by partition walls, and the partition walls are configured to reflect light emitted from side surfaces of the first color conversion layer, the second color conversion layer, and the third color conversion layer.

According to one or more embodiments, at least one of the partition walls includes a white-based color.

According to one or more embodiments, at least one of the partition walls has a surface on which a metal film is formed.

According to one or more embodiments, the side surfaces of the first self-luminescence element, the second self-luminescence element, and the third self-luminescence element are respectively adhered to the partition walls by an optical adhesive.

According to one or more embodiments, portions of the surfaces of the first color conversion layer, the second color conversion layer, and the third color conversion layer that are respectively outwards from the light emitting surfaces of the first self-luminescence element, the second self-luminescence element, and the third self-luminescence element, in a second direction that is perpendicular to the first direction, are adhered with the optical adhesive, and the optical adhesive is UV curing silicon rubber.

According to one or more embodiments, the first color conversion layer includes a color conversion material that is configured to emit light of a red wavelength range, wherein the second color conversion layer includes a color conversion material that is configured to emit light of a green wavelength range, and wherein the third color conversion layer includes a color conversion material that is configured to emit light of a blue wavelength range.

According to one or more embodiments, the color conversion material of the first color conversion layer is a red nanophosphor, wherein the color conversion material of the second color conversion layer is a green nanophosphor, and wherein the color conversion material of the third color conversion layer is a blue nanophosphor.

According to one or more embodiments, the red nanophosphor is $Si_{1-x}Ca_xAlSiN_3{:}Eu_{2+}$.

According to one or more embodiments, the green nanophosphor is $Si_{6-z}Al_zO_zN_{8-z}{:}Eu_{2+}$ or $SrGa_2S_4$.

According to one or more embodiments, the blue nanophosphor is $BaMg_xAl_yO_z:Eu_{n+}$.

According to one or more embodiments, the red nanophosphor and the green nanophosphor are respectively configured with a particle size distribution median value $d_{50}$ of less than 0.5 μm.

According to one or more embodiments, the color conversion material of the first color conversion layer includes a red quantum dot, the color conversion material of the second color conversion layer includes a green quantum dot, and the color conversion material of the third color conversion layer includes a blue quantum dot.

According to one or more embodiments, a black matrix is formed between the first color filter, the second color filter, and the transparent resin layer.

According to one or more embodiments, the UV cutoff filter is configured with a transmittance of less than or equal to 10% based on a wavelength of less than or equal to 400 nm.

According to one or more embodiments, the UV cutoff filter includes: a transparent resin; and UV absorbing particles which are mixed in the transparent resin, wherein a material of the UV absorbing particle is $TiO_2$ or $SiO_2$, and a size distribution median value $d_{50}$ of the UV absorbing particles is less than 0.2 μm.

According to one or more embodiments, the display module further includes a plurality of substrate electrodes formed on the substrate; and an anisotropic conductive film, wherein chip electrodes of the first self-luminescence element, the second self-luminescence element, and the third self-luminescence element are electrically and physically coupled to the plurality of substrate electrodes by the anisotropic conductive film.

According to embodiments, a manufacturing method of a display module is provided. The manufacturing method includes: attaching a UV cutoff filter to one surface of a first substrate; forming a first part by sequentially forming a black matrix, color filters, a planarization layer, partition walls, and color conversion layers to another surface of the first substrate, that is opposite to the one surface of the first substrate; forming a second part by transferring self-luminescence elements, which are configured to emit light of an ultraviolet wavelength range, to a second substrate; arranging one of the color conversion layers of the first part and one of the self-luminescence elements of the second part to correspond with each other; and bonding the first part and the second part.

According to one or more embodiments, the forming the first part includes: forming the black matrix in a grid form on the first substrate; forming the color filters on the first substrate; forming the planarization layer on the color filters; forming the partition walls on the planarization layer such that sub pixel areas are defined between the partition walls; and forming the color conversion layers in respective ones of the sub pixel areas defined by the partition walls.

According to one or more embodiments, the forming the second part includes: attaching an anisotropic conductive film to the second substrate; transferring the self-luminescence elements to the second substrate; applying an optical adhesive to a front surface of the second substrate so as to cover the self-luminescence elements for bonding the first part and the second part together; and exposing the optical adhesive to ultraviolet (UV) rays.

According to embodiments, a pixel for a display module is provided. The pixel includes: a first self-luminescence element, a second self-luminescence element, and a third self-luminescence element that are configured to emit light of an ultraviolet wavelength range; a first color conversion layer, a second color conversion layer, and a third color conversion layer respectively corresponding to light emitting surfaces of the first self-luminescence element, the second self-luminescence element, and the third self-luminescence element; a first color filter and a second color filter respectively corresponding to the first color conversion layer and the second color conversion layer; a transparent resin layer corresponding to the third color conversion layer and disposed on a same plane as a plane at which the first color filter and the second color filter are positioned; a transparent cover layer that covers the first color filter, the second color filter, and the transparent resin layer; and an ultraviolet (UV) cutoff filter that covers the transparent cover layer, wherein areas of surfaces of the first color conversion layer, the second color conversion layer, and the third color conversion layer, that respectively face in a first direction toward the light emitting surfaces of the first self-luminescence element, the second self-luminescence element, and the third self-luminescence element, are respectively greater than areas of the light emitting surfaces of the first self-luminescence element, the second self-luminescence element, and the third self-luminescence element.

DETAILED DESCRIPTION

Figure 1:
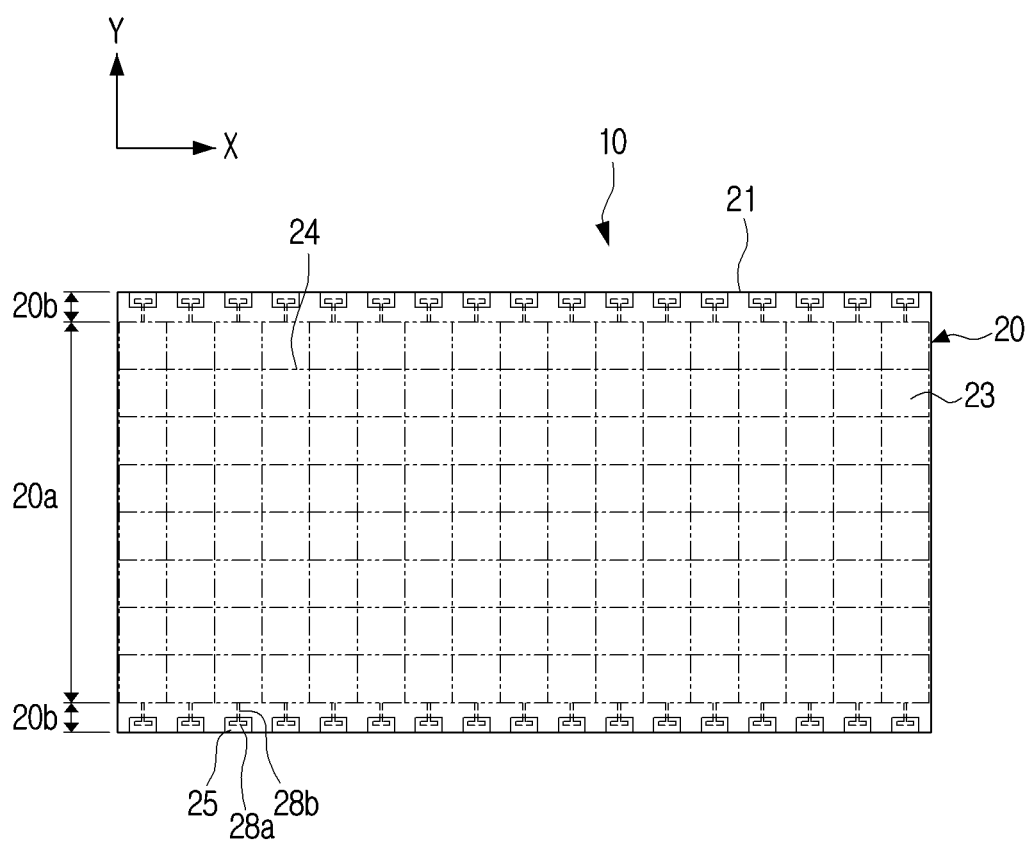
FIG. 1 is a schematic front view illustrating a display module according to an embodiment.

Various non-limiting example embodiments will be described in greater detail below with reference to the accompanied drawings. The embodiments described herein may be variously modified. Specific embodiments may be illustrated in the drawings and described in detail in the description. However, the specific embodiments described in the accompanied drawings are merely to assist in the understanding of the various embodiments. Accordingly, the specific embodiments disclosed in the accompanied drawings are not for limiting the scope of the disclosure to a specific embodiment, and should be interpreted to include all modifications or alternatives included in the technical spirit and scope of the disclosure.

Terms including ordinal numbers such as first, second, and the like may be used to describe various elements, but these elements are not limited by the above-described terms. The above-described terms may be used only to distinguish one element from another element.

In the disclosure, it is to be understood that terms such as "comprise," "include," or the like are used herein to designate a presence of a characteristic, number, step, operation, element, component, or a combination thereof, and not to preclude a presence or a possibility of adding one or more of other characteristics, numbers, steps, operations, elements, components, or a combination thereof. When a certain element is indicated as being "coupled with/to" or "connected to" another element, it is to be understood that the certain element may be directly coupled to or connected to the another element, but that another element may be present therebetween. On the other hand, when a certain element is indicated as being "directly coupled with/to" or "directly connected to" another element, it is to be understood that another element is not present therebetween.

In the disclosure, the expression 'same' may not only mean fully matching, but also include a difference to a degree of taking into consideration a processing error range.

In addition thereto, in describing the disclosure, in case it is determined that the detailed description of related known technologies may unnecessarily confuse the gist of the disclosure, the detailed description thereof will be abridged or omitted.

In the disclosure, a display module may be a display panel provided with a micro light-emitting diode which is a self-luminescence element for displaying an image. The display module may be one from among a flat panel display panel, each of which are configured with a plurality of inorganic light-emitting diodes (inorganic LEDs) of less than or equal to 100 micrometers and may provide better contrast, response time, and energy efficiency than a liquid crystal display (LCD) panel which requires a backlight. Because the micro light emitting diode used for displaying an image is a self-luminescence element, the display module may not need to have a separate backlight.

In the disclosure, both an organic light-emitting diode (organic LED) and a micro LED, which is an inorganic light-emitting diode, have good energy efficiency, but the micro LED has longer brightness, light-emitting efficiency, and life span than the OLED. The micro LED may be a semiconductor chip configured to emit light on its own when power is supplied. The micro LED may have a fast response rate, low power, and a high brightness. For example, the micro LED may have higher efficiency in converting electricity to photons compared to the liquid crystal display (LCD) or the organic light-emitting diode (OLED) of the related art. That is, a "brightness per watt" compared to the LCD or the OLED display of the related art may be higher. Accordingly, the micro LED may be configured to show a same brightness with an energy of about half compared to the LED (width, length, and height respectively exceeding 100 μm) or the OLED of the related art. In addition to the above, the micro LED may realize a high resolution, a superior color, shading and brightness, express color of a wide range accurately, express colors of a wide range accurately, and realize a screen that is clear even in the outdoors. Further, the micro LED may be guaranteed a long life span because it is strong against a burn in phenomenon and there is no deformation due to little heat being generated. The micro LED may have a flip chip structure in which an anode electrode and a cathode electrode are formed at a same first surface and a light-emitting surface is formed at a second surface positioned at an opposite side of the first surface at which the electrodes are formed.

According to embodiments of the disclosure, one pixel may include at least three sub pixels. One sub pixel may be a micro self-luminescence element for displaying an image, and may mean, for example, an ultraviolet micro light emitting diode (UV micro LED). The UV micro LED may be a self-luminescence element that emits light of an ultraviolet wavelength range (360-410 nm).

According to embodiments of the disclosure, the one sub pixel may include, in addition to the one micro self-luminescence element, a color conversion layer and a color filter corresponding thereto. The color conversion layer may emit a color of a predetermined wavelength range by being excited by light diverged from the micro self-luminescence element. The color conversion layer may be formed of a material including a nanophosphor or a quantum dot.

One sub pixel area may mean an area to which a color of a corresponding sub pixel is exhibited by light emitted from the one sub pixel. In the disclosure, a one surface area (horizontal length×vertical length) of the color conversion layer which corresponds to the sub pixel may be greater than a light emitting surface area of the sub pixel. In this case, the sub pixel area may correspond to the area of the color conversion layer.

According to embodiments of the disclosure, a substrate may be disposed with a TFT layer on which a thin film transistor (TFT) circuit is formed at a front surface, and disposed with a timing controller configured to control a power supply circuit and a data driving driver configured to supply power to the TFT circuit, a gate driving driver, and respective driving drivers at the rear surface. Multiple pixels arranged on the TFT layer may be driven by the TFT circuit.

According to embodiments of the disclosure, a glass substrate, a synthetic resin-based (e.g., polyimide (PI), polyethylene terephthalate (PET), polyethersulfone (PES), polyethylene naphthalate (PEN), polycarbonate (PC), etc.) substrate, or a ceramic substrate may be used for the substrate.

According to embodiments of the disclosure, the TFT layer on which the TFT circuit is formed may be disposed at the front surface of the substrate, and circuits may not be disposed at the rear surface of the substrate. The TFT layer may be formed integrally on the substrate or adhered to one surface of the glass substrate manufactured in a separate film form.

According to embodiments of the disclosure, the front surface of the substrate may be divided into an active area and a dummy area. The active area may correspond to an area occupied by the TFT layer at the front surface of the substrate, and the dummy area may be an area other than the area occupied by the TFT layer at the front surface of the substrate.

According to embodiments of the disclosure, an edge area of the substrate may be an outermost side area of the glass substrate. In addition, the edge area of the substrate may be a remaining area excluding an area at which a circuit of the substrate is formed. In addition, the edge area of the substrate may include a part of the front surface of the substrate which is adjacent to a side surface of the substrate and a part of the rear surface of the substrate which is adjacent to the side surface of the substrate. The substrate may be formed as a quadrangle type. Specifically, the substrate may be formed as a rectangle type or a square type. The edge area of the substrate may include at least one side from among the four sides of the glass substrate.

According to embodiments of the disclosure, the TFT forming the TFT layer (or backplane) is not limited to a specific structure or type. For example, the TFT may be realized with an oxide TFT and an Si TFT (poly silicon, a-silicon), an organic TFT, a graphene TFT, and the like in addition to a low-temperature polycrystalline silicon TFT (LTPS TFT), and may be applied by making only a P type (or N type) metal-oxide-semiconductor field-effect transistor (MOSFET) in a Si wafer complementary metal-oxide-semiconductor (CMOS) process.

According to embodiments of the disclosure, a pixel driving method of the display module may be an active matrix (AM) driving method or a passive matrix (PM) driving method. The display module may be configured to form a wiring pattern to which the respective micro LEDs are electrically connected according to the AM driving method or the PM driving method.

According to embodiments of the disclosure, one pixel area may be disposed with a plurality of pulse amplitude modulation (PAM) control circuits. In this case, respective sub pixels disposed at the one pixel area may be controlled by the corresponding PAM control circuits. In addition, the one pixel area may be disposed with a plurality of pulse width modulation (PWM) control circuits. In this case, the respective sub pixels disposed at the one pixel area may be controlled by the corresponding PWM control circuits.

According to embodiments of the disclosure, the one pixel area may be disposed with both the plurality of PAM control circuits and the plurality of PWM control circuits. In this case, some from among the sub pixels disposed at the one pixel area may be controlled by the PAM control circuit and the remaining may be controlled through the PWM control circuit. In addition, the respective sub pixels may be controlled by the PAM control circuit and the PWM control circuit.

According to embodiments of the disclosure, the display module may include multiple side surface wirings of a thin film thickness disposed at a certain distance along the side surface based on the TFT substrate being a glass substrate.

According to embodiments of the disclosure, the display module may include multiple through wiring members formed so as to not be exposed toward the side surface of the TFT substrate in place of the side surface wiring which is exposed toward the side surface when the TFT substrate is a plastic substrate. Accordingly, by minimizing the dummy area and maximizing the active area at the front surface of the TFT substrate, bezel-less-ness may be achieved, and a mounting density of the micro LEDs with respect to the display module may be increased.

According to embodiments of the disclosure, based on coupling multiple display modules realizing bezel-less-ness, a large size multi display device capable of maximizing the active area may be provided. In this case, the respective display modules may be formed to maintain a pitch between the respective pixels of the display module adjacent to one another to be the same as a pitch between the respective pixels in a single display module based on minimizing the dummy area. Accordingly, this may be one method for a seam to be not visible at a coupling part between the respective display modules.

According to embodiments of the disclosure, a driving circuit may be realized by a micro integrated circuit (IC) configured to control the driving of at least 2n pixels disposed at the pixel area. Based on applying the micro IC to the display module, rather than the TFT, only a channel layer coupling the micro IC with the respective micro LEDs may be formed at the TFT layer (or backplane).

According to embodiments of the disclosure, the display module may be installed, as a single unit, in a wearable device, a portable device, a handheld device, and an electronic product requiring various displays or applied in an electric field, and may be applied to a display device such as, for example, and without limitation, a monitor for a personal computer (PC), a high resolution TV and signage (or, digital signage), an electronic display, or the like through a plurality of assemblies as a matrix type.

A display module according to an embodiment will be described below with reference to the drawing.

Figure 2:
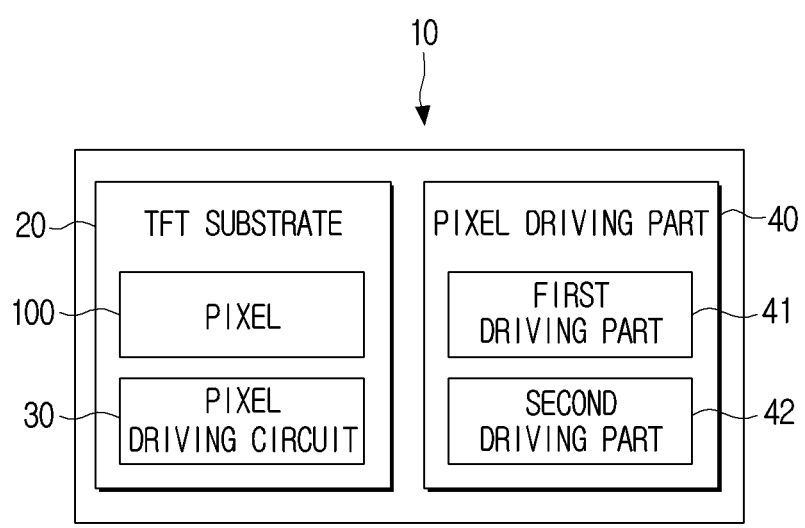
FIG. 2 is a schematic block diagram illustrating a display module according to an embodiment.

FIG. 1 is a schematic front view illustrating the display module according to a first embodiment, FIG. 2 is a schematic block diagram illustrating the display module according to the first embodiment.

Referring to FIG. 1 and FIG. 2, the display module 10 according to an embodiment of the disclosure may include a TFT substrate 20 on which a plurality of a pixel driving circuit 30 is formed, a plurality of a pixel 100 arranged at the front surface of the TFT substrate 20, and a panel driving part 40 configured to generate a control signal and provide the generated control signal to the plurality of the pixel driving circuit 30.

According to embodiments of the disclosure, one pixel may include multiple sub pixels. The one sub pixel may include one light source, and the color conversion layer and the color filter corresponding to the light source. Here, the light source may be an inorganic self-light emitting diode, and may be, for example, an ultraviolet micro light emitting diode (UV micro LED) having a size of less than or equal to 100 μm (preferably less than or equal to 30 μm). The UV micro LED may emit light of an ultraviolet wavelength range (360-410 nm). A structure of a pixel 100 will be described in detail below with reference to FIG. 3.

The TFT substrate 20 may include a glass substrate 21, a TFT layer 23 on which a thin film transistor (TFT) circuity is included at the front surface of the glass substrate 21, and multiple side surface wirings 25 electrically coupling the TFT circuit of the TFT layer 23 and the circuits disposed at the rear surface of the glass substrate.

According to embodiments of the disclosure, a synthetic resin-based (e.g., polyimide (PI), polyethylene terephthalate (PET), polyethersulfone (PES), polyethylene naphthalate (PEN), polycarbonate (PC), etc.) substrate having a flexible material or a ceramic substrate may be used as a substitute of the glass substrate 21.

The TFT substrate 20 may include an active area 20*a* representing an image, and a dummy area 20*b* incapable of representing an image at the front surface.

The active area 20*a* may be divided into multiple pixel areas 24 at which multiple pixels are respectively arranged. The multiple pixel areas 24 may be divided into various forms, and as an example, may be divided into a matrix form. One of the pixel areas 24 may be included with one pixel 100 (referring to FIG. 3).

The dummy area 20*b* may be included in the edge area of the glass substrate, and multiple connection pads 28*a*, which are disposed spaced apart at a certain distance along the edge area, may be formed. The multiple connection pads 28*a* may be electrically coupled with the respective pixel driving circuits 30 through the respective wirings 28*b*.

The number of connection pads 28*a* formed in the dummy area 20*b* may vary according to the number of pixels realized on the glass substrate, and may vary according to the driving method of the TFT circuit disposed in the active area 20a. For example, the TFT circuit disposed in the active area 20a may require more wirings and connection pads for the active matrix (AM) driving method, which drives the respective pixels individually, compared to the passive matrix (PM) driving method, which drives multiple pixels in a horizontal line and a vertical line.

The TFT layer 23 may include multiple data signal lines disposed horizontally, multiple gate signal lines disposed vertically, and multiple pixel driving circuits 30 electrically coupled to the respective lines to control the plurality of the pixel 100.

The panel driving part 40 may be directly coupled to the TFT substrate 20 in a chip on glass (COG) or a chip on plastic (COP) bonding method, or indirectly coupled to the TFT substrate 20 through a separate flexible printed circuit board (FPCB) in a film on glass (FOG) bonding method. The panel driving part 40 may drive the pixel driving circuits 30 to control the emission of micro LEDs which are electrically coupled to respective ones of the pixel driving circuits 30.

The panel driving part 40 may be configured to control the pixel driving circuits 30 by the respective lines through a first driving part 41 and a second driving part 42. The first driving part 41 may be configured to generate a control signal for sequentially controlling the horizontal lines formed on the TFT substrate 20 for each line per image frame, and transmit the generated control signal to the pixel driving circuits 30 which are respectively coupled to the corresponding lines. The second driving part 42 may be configured to generate a control signal for sequentially controlling the vertical lines formed on the TFT substrate 20 for each line per image frame, and transmit the generated control signal to the pixel driving circuits 30 which are respectively coupled to the corresponding lines.

Figure 3:
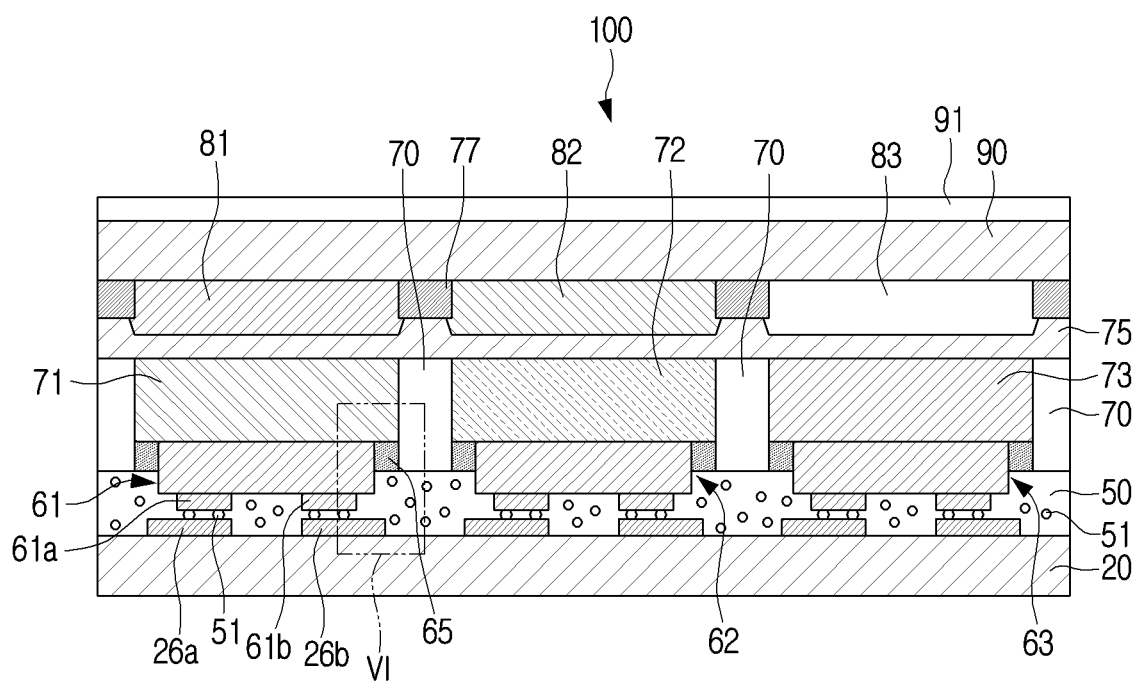
FIG. 3 is a cross-sectional view illustrating a single pixel of a display module according to an embodiment.
Figure 4:
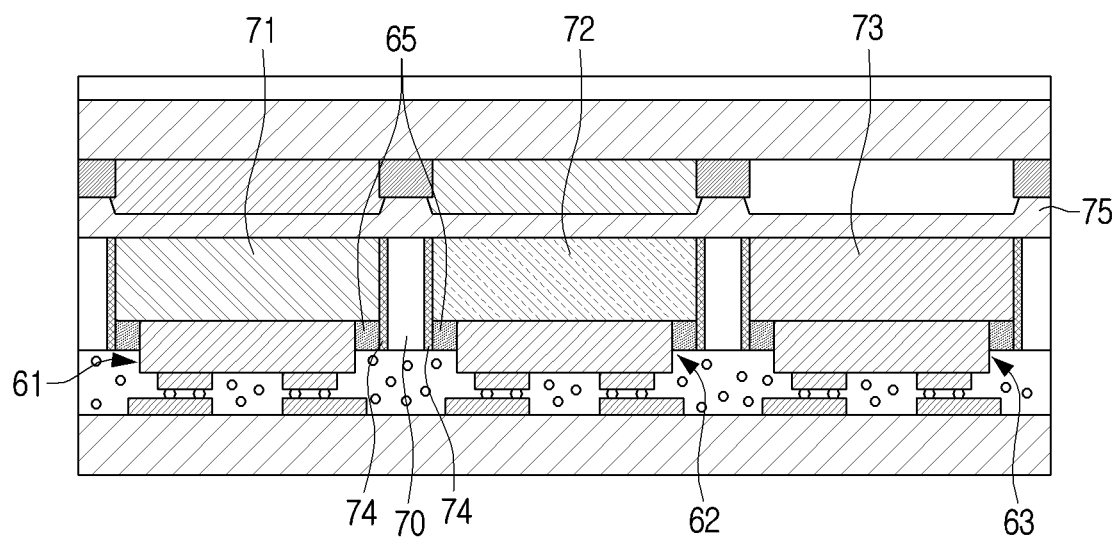
FIG. 4 is a cross-sectional view illustrating an example of a metal film being formed at a side surface of a partition wall.
Figure 5:
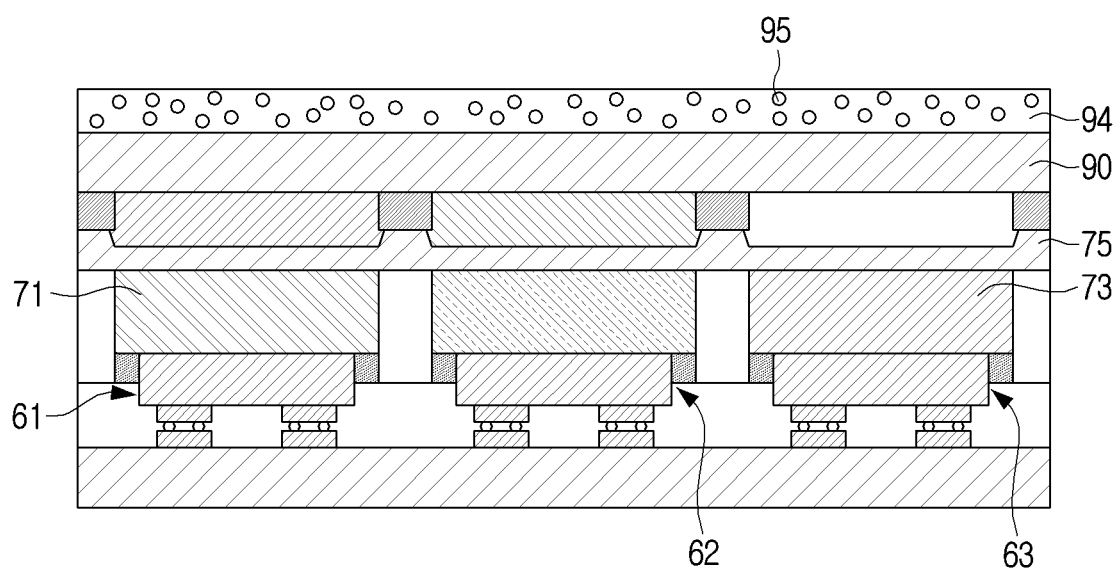
FIG. 5 is a view illustrating another example of a UV cutoff layer.
Figure 6:
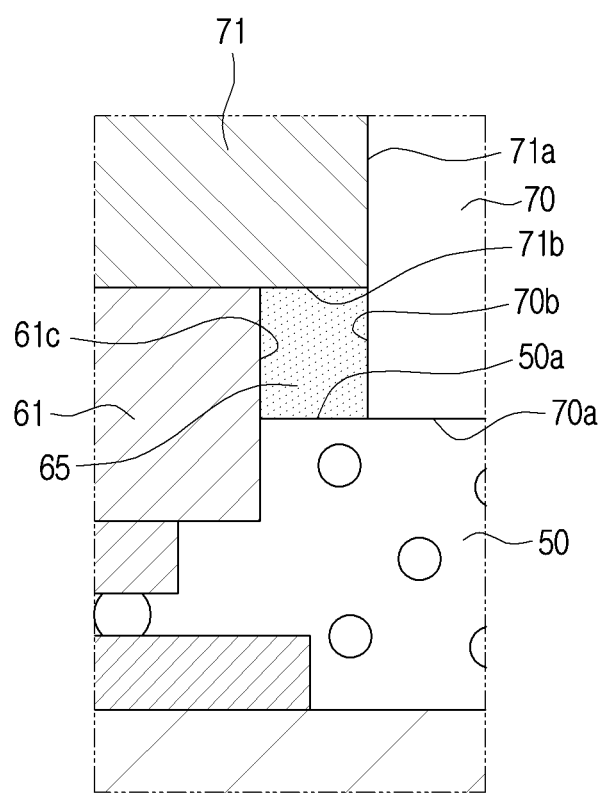
FIG. 6 is an enlarged view of part VI shown in FIG. 3.

FIG. 3 is a cross-sectional view illustrating a single pixel of a display module according to an embodiment, FIG. 4 is a cross-sectional view illustrating an example of a metal film being formed at a side surface of a partition wall, FIG. 5 is a view illustrating another example of a UV cutoff layer, and FIG. 6 is an enlarged view of part VI shown in FIG. 3.

Referring to FIG. 3, one pixel 100 may be included in one of the pixel areas 24 (referring to FIG. 1).

The pixel 100 may include light of a same color, for example, at least three UV micro LEDs (e.g., a first UV micro LED 61, a second UV micro LED 62, and a third UV micro LED 63) that emit light of an ultraviolet wavelength range (360-410 nm).

The first UV micro LED 61, the second UV micro LED 62, and the third UV micro LED 63 may be electrically and physically coupled to the TFT substrate 20 through an anisotropic conductive film (ACF) 50 which is laminated to the front surface of the TFT substrate 20.

The anisotropic conductive film 50 may include a thermosetting resin (an epoxy resin, a polyurethane resin, an acrylic resin, etc.) and multiple conductive balls 51 having a fine diameter (e.g., 3-15 μm) in the thermosetting resin. Each of the conductive balls 51 may include a polymer particle and a conductive film of Au, Ni, Pd, and the like which are coated to the surface of the polymer particle. The anisotropic conductive film 50 may have conductivity in a compression direction and have insulation in a vertical direction of the compression direction.

The first UV micro LED 61, the second UV micro LED 62, and the third UV micro LED 63 may have a flip chip structure configured such that two chip electrodes (e.g. a first chip electrode 61a and a second chip electrode 61b), which are an anode electrode and a cathode electrode, are formed at an opposite side from the light emitting surface. The first chip electrode 61a and the second chip electrode 61b may be formed of any one from among Al, Ti, Cr, Ni, Pd, Ag, Ge and Au, or formed of an alloy thereof.

The first UV micro LED 61, the second UV micro LED 62, and the third UV micro LED 63 may be positioned at a surface of the anisotropic conductive film 50, that is opposite to a surface of the anisotropic conductive film 50 that is attached to the TFT substrate 20, when transferred to the TFT substrate 20. Then, the first UV micro LED 61, the second UV micro LED 62, and the third UV micro LED 63 may be inserted together inside the anisotropic conductive film 50 through a thermocompression process by a predetermined depth. Accordingly, the first UV micro LED 61, the second UV micro LED 62, and the third UV micro LED 63 may be physically fixed to the TFT substrate 20 by the anisotropic conductive film 50.

In addition, based on the first UV micro LED 61 being pressed toward the TFT substrate 20 by the thermocompression process, the first chip electrode 61a and the second chip electrode 61b of the first UV micro LED 61 may be positioned adjacently with a first substrate electrode pad 26a and a second substrate electrode pad 26b. In this case, the first chip electrode 61a and the second chip electrode 61b of the first UV micro LED 61 may be electrically coupled with the first substrate electrode pad 26a and the second substrate electrode pad 26b by the conductive balls 51 positioned between the first chip electrode 61a and the second chip electrode 61b of the first UV micro LED 61 and the first substrate electrode pad 26a and the second substrate electrode pad 26b. Likewise, the second UV micro LED 62 and the third UV micro LED 63 may also be electrically coupled to the substrate electrode pads corresponding to the respective chip electrodes through the conductive balls 51 in the same method as with the first UV micro LED 61.

Referring to FIG. 3, the pixel 100 may include a first color conversion layer 71, a second color conversion layer 72, and a third color conversion layer 73 corresponding to the light emitting surfaces of the first UV micro LED 61, the second UV micro LED 62, and the third UV micro LED 63, respectively.

The first color conversion layer 71, the second color conversion layer 72, and the third color conversion layer 73 may include a nanophosphor which absorbs light emitted from the first UV micro LED 61, the second UV micro LED 62, and the third UV micro LED 63, converts to a light of different wavelength ranges from one another, and emits the converted light. The nanophosphor represents different physical characteristics compared to a phosphor of the related art of which the particle diameter is several μm. For example, luminance efficiency may be improved because the wavelength of light that emits light has high energy due an energy band gap, which is an energy level structure of a quantum state of electrons within a nanophosphor crystal, is large. The nanophosphor may improve the display efficiency as colliding electrons effectively contribute in the luminescence based on particle density of phosphor increasing compared to phosphor having a bulk structure.

The first color conversion layer 71 may include a red nanophosphor capable of emitting light of a red wavelength range by being be excited by a light of a blue wavelength range emitted from the first UV micro LED 61. For example, the red nanophosphor may be $SCASN(Si_{1-x}Ca_xAlSiN_3:Eu_{2+})$. In this case, the red nanophosphor may have a particle size distribution median value $d_{50}$ of less than 0.5 μm (preferably, 0.1 μm<$d_{50}$<0.5 μm).

The second color conversion layer 72 may include a green nanophosphor capable of emitting light of a green wavelength range by being excited by light of a blue wavelength range emitted from a second UV micro LED 62. For example, the green nanophosphor may be β-SiAlON ($Si_{6-z}Al_zO_zN_{8-z}:Eu_{2+}$) or $SrGa_2S_4$. In this case, the green nanophosphor may have a particle size distribution median value $d_{50}$ of less than 0.5 μm (preferably, 0.1 μm<d50<0.5 μm).

The third color conversion layer 73 may include a blue nanophosphor capable of emitting light of a blue wavelength range by being excited by light of a ultraviolet wavelength range emitted from the third UV micro LED 63. For example, the blue nanophosphor may be BAM($BaMg_xAl_y$-$O_z:Eu_{n+}$). In this case, the blue nanophosphor may have a particle size distribution median value $d_{50}$ of less than 0.5 μm (preferably, 0.1 μm<$c_{50}$<0.5 μm).

The first color conversion layer 71 may be formed of a material which includes a red quantum dot that emits light of a red wavelength range as an alternative of the red nanophosphor. The second color conversion layer 72 may be formed of a material which includes a green quantum dot that emits light of a green wavelength range as an alternative of the green nanophosphor. The third color conversion layer 73 may be formed of a material which includes a blue quantum dot that emits light of a blue wavelength range as an alternative of the blue nanophosphor.

A first color filter 81, a second color filter 82, and a transparent resin layer 83 may be disposed respectively at a top side of the first color conversion layer 71, the second color conversion layer 72, and the third color conversion layer 73.

The first color filter 81 may be a red color filter which passes the same color wavelength as the wavelength of the light of the red wavelength range emitted from the first color conversion layer 71. The second color filter 82 may be a green color filter which passes the same color wavelength as the wavelength of the light of the green wavelength range emitted from the second color conversion layer 72.

The transparent resin layer 83 may be formed of a material which may not affect or minimize effect to transmittance, reflectivity and a refractive index of light emitted from the third color conversion layer 73. In addition, the transparent resin layer 83 may be an optical film which may minimize light being wasted by directing the direction of light toward the front surface through refraction and reflection and enhancing brightness.

The first UV micro LED 61, the second UV micro LED 62, and the third UV micro LED 63 may have a predetermined thickness and may be formed as a square type with a same width and length, or as a rectangle type with a different width and length. The UV micro LED as described above may realize a real high dynamic range (Real HDR), and provide an improved brightness and black expression, and a high contrast ratio compared to an OLED. The size of the UV micro LED may be less than or equal to 100 μm, or preferably less than or equal to 30 μm.

Referring to FIG. 3, the pixel 100 may be configured such that a light emitting area of the first UV micro LED 61, the second UV micro LED 62, and the third UV micro LED 63 is divided by partition walls 70. The partition walls 70 may be formed roughly in a grid shape. The multiple light emitting areas divided by the partition walls 70 may respectively correspond to one sub pixel area.

The partition walls 70 may be configured such that a top end is in close contact with a planarization layer 75 and a bottom end is in close contact with a top surface of the anisotropic conductive film 50. The first color conversion layer 71, the second color conversion layer 72, and the third color conversion layer 73 may be disposed in the respective light emitting areas divided by the partition walls 70.

Accordingly, the light emitted to a side surface of the first color conversion layer 71 may be reflected by one of the partition walls 70 and emitted to the first color filter 81. The light emitted to a side surface of the second color conversion layer 72 may be reflected by one of the partition walls 70 and emitted to the second color filter 82. In addition, the light emitted to a side surface of the third color conversion layer 73 may be reflected by one of the partition walls 70 and emitted to a front direction of the display module 10 through the transparent resin layer 83.

The partition walls 70 may have a white-based color with superior light reflectivity to function as a reflector. Here, the white-based color may include a true white and an off-white. The off-white may mean all colors close to white.

The partition walls 70 may also be formed of a metal material having high reflectivity so as to function as a reflector. In addition, the partition walls 70 may be formed with a metal film 74 having high light reflectivity stacked to the side surface as in FIG. 4. In this case, it is not necessary for the partition walls 70 to have a white-based color.

The light emitting surfaces of the first UV micro LED 61, the second UV micro LED 62, and the third UV micro LED 63 may be positioned at roughly the same height from the top surface of the TFT substrate 20. In addition, the light emitting surfaces of the first UV micro LED 61, the second UV micro LED 62, and the third UV micro LED 63 may be positioned at a position higher than the bottom ends of the partition walls 70. In this case, parts of the side surfaces of the first UV micro LED 61, the second UV micro LED 62, and the third UV micro LED 63 may face the partition walls 70. Accordingly, the light emitted from the side surfaces of the first UV micro LED 61, the second UV micro LED 62, and the third UV micro LED 63 may be reflected by the partition walls 70 and emitted to the first color conversion layer 71, the second color conversion layer 72, and the third color conversion layer 73, respectively.

Accordingly, the partition walls 70 may maximize luminance efficiency by reflecting the light emitted from the side surfaces of the first UV micro LED 61, the second UV micro LED 62, and the third UV micro LED 63, and the light emitted from the side surfaces of the first UV micro LED 61, the second UV micro LED 62, and the third UV micro LED 63, and by emitting to the front surface of the display module 10, and may enhance distribution in all of the red, green, and blue sub pixel areas.

The planarization layer 75 may be disposed between the conversion layers (e.g., the first color conversion layer 71, the second color conversion layer 72, and the third color conversion layer 73) and the first color filter 81, the second color filter 82, and the transparent resin layer 83.

The planarization layer 75 may be stacked over the first color filter 81, the second color filter 82, and the transparent resin layer 83 prior to forming the partition walls 70 when manufacturing a first part 11 (referring to FIG. 9) of the display module 10.

The planarization layer 75 may be formed of a material which may not affect or minimize effect to the transmittance, the reflectivity, and the refractive index of light which passed through the first color conversion layer 71, the second color conversion layer 72, and the third color conversion layer 73.

The first color filter 81, the second color filter 82, and the transparent resin layer 83 may be divided therebetween by a black matrix 77 which is formed in a grid form. The shape of the black matrix 77 may be formed in the grid form to correspond to the shape of the partition walls 70. In this case, the width of the black matrix 77 may be formed similarly with the width of the partition walls 70.

A transparent cover layer 90 may be formed at the top side of the first color filter 81, the second color filter 82, and the transparent resin layer 83. The transparent cover layer 90 may prevent the pixel 100 from being contaminated by a foreign substance and protect the pixel 100 from being damaged from an external force. The transparent cover layer 90 may apply to the glass substrate.

In addition, a UV cutoff filter 91, that is a thin film, may be formed stacked to one surface of the transparent cover layer 90. The UV cutoff filter 91 may block ultraviolet rays emitted from the first UV micro LED 61, the second UV micro LED 62, and the third UV micro LED 63. The UV cutoff filter 91 may have a transmittance of less than or equal to 10% based on a wavelength of less than or equal to 400 nm.

The UV cutoff filter 91 may use a neutral density (ND) filter of a film form.

In addition, the UV cutoff filter 91 may be formed to include a transparent resin 94 for coating and UV absorbing particles 95 in the transparent resin 94 as in FIG. 5 as an alternative of the ND filter.

The UV absorbing particles 95 may be mixed to be evenly distributed in the transparent resin 94. The material of the UV absorbing particles 95 may be $TiO_2$ or $SiO_2$. In this case, the UV absorbing particle size distribution median value d50 may be less than 0.2 μm.

In FIG. 3, only a part of the partition wall 70, the planarization layer 75, the black matrix 77, and the transparent cover layer 90 that corresponds to one pixel unit has been illustrated, but the partition walls 70, the planarization layer 75, the black matrix 77, and the transparent cover layer 90 may be formed to a size of an extent that roughly corresponds to the size of the TFT substrate 20.

The sizes of the first UV micro LED 61, the second UV micro LED 62, and the third UV micro LED 63 may be formed smaller than the sizes of the first color conversion layer 71, the second color conversion layer 72, and the third color conversion layer 73, respectively. Accordingly, because sides of the bottom ends of the partition walls 70 are formed at positions facing the side surfaces of the first UV micro LED 61, the second UV micro LED 62, and the third UV micro LED 63, gaps may be formed between the side surfaces of the first UV micro LED 61, the second UV micro LED 62, and the third UV micro LED 63, and the partition walls 70.

Referring to FIG. 6, the gaps may be filled with an optical adhesive 65. The optical adhesive 65 may be respectively adhered to a side surface part 61c of the first UV micro LED 61, a bottom end side surface part 70b of the partition wall 70, a bottom surface part 71b of the first color conversion layer 71, and a top surface part 50a of the anisotropic conductive film 50. Accordingly, the partition walls 70 may be stably fixed to the TFT substrate 20 as it is firmly coupled with the surrounding structures through the optical adhesive 65.

The optical adhesive 65 may be used to bond the first part 11 and a second part 12 of the display module 10 to be described below together.

The manufacturing process of the first and second parts of the display module 10 and the bonding process of the first and second parts according to an embodiment will be sequentially described in detail below with reference to the drawings.

Figure 7:
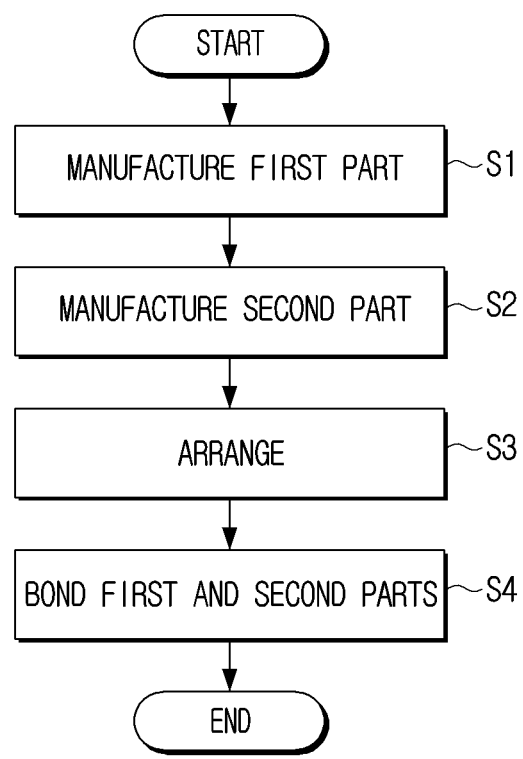
FIG. 7 is a schematic flowchart illustrating a manufacturing process of a display module according to an embodiment.

FIG. 7 is a schematic flowchart illustrating a manufacturing process of a display module according to an embodiment.

Referring to FIG. 7, the overall manufacturing process of the display module 10 according to an embodiment may be schematically described as below.

First, the first part 11 (referring to FIG. 9) may be manufactured by sequentially forming the color filters, the planarization layer, the partition walls, and the color conversion layers on the glass substrate (S1), and the second part 12 (referring to FIG. 11) may be manufactured by transferring the multiple micro LEDs to the TFT substrate 20 separately from the first part (S2).

After positioning the second part 12 in a die, the first part 11 may be disposed spaced apart by a predetermined distance at the top side of the second part 12.

Then, after arranging the first part 11 and the second part 12 to bond the first part 11 and the second part 12 together (S3), the first part 11 may be pressed toward the second part 12 to be bonded together (S4).

The manufacturing process of the first and second parts of the display module 10 and the bonding process of the first and second parts according to an embodiment will be sequentially described in detail below with reference to the drawings.

Figure 8:
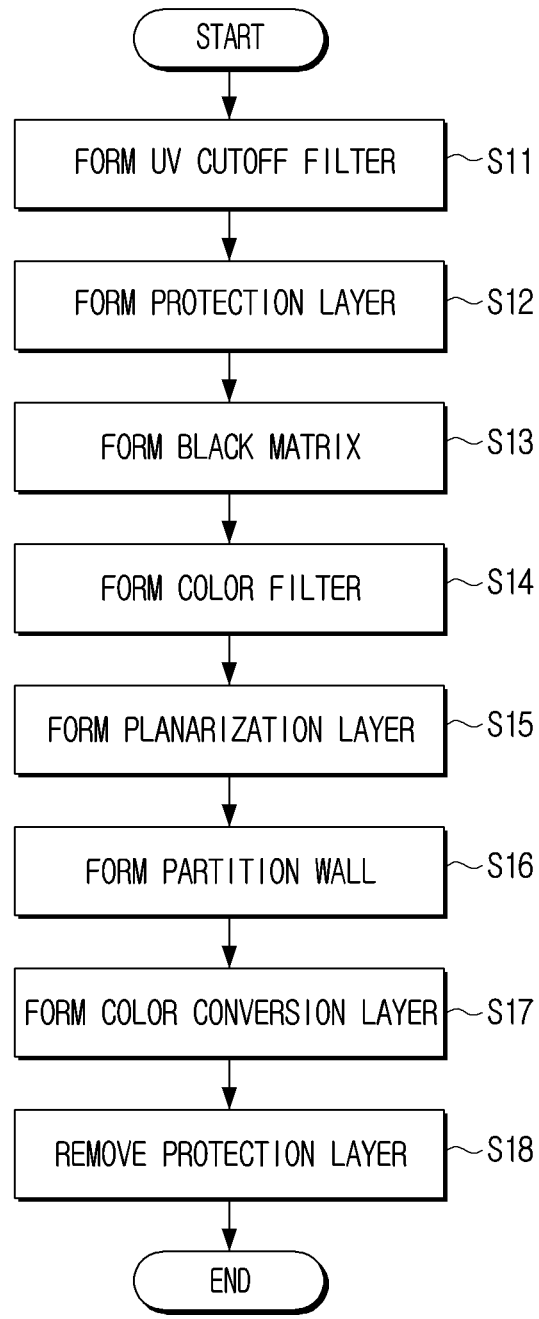
FIG. 8 is a flowchart illustrating a manufacturing process of a first part of a display module according to an embodiment.
Figure 9:
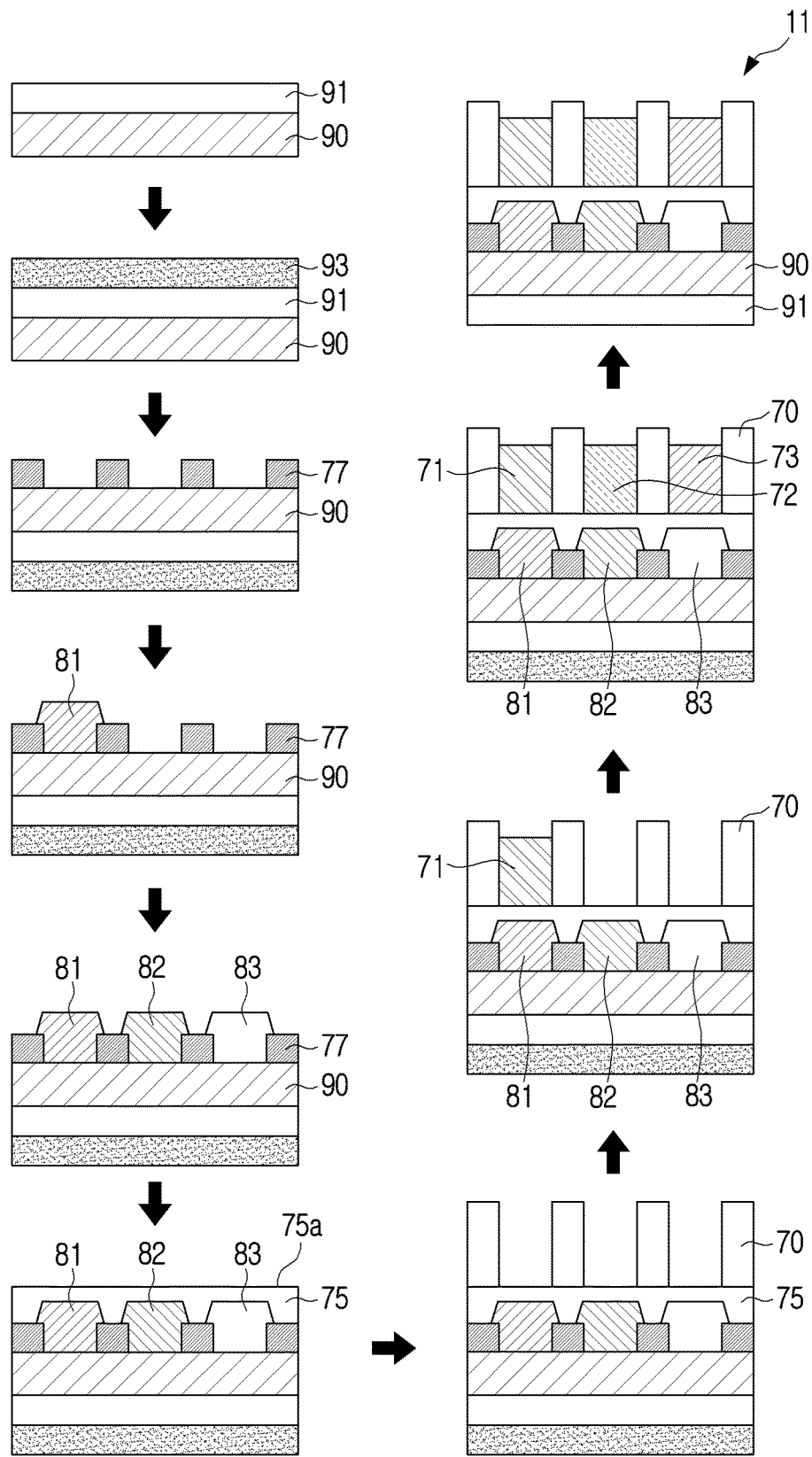
FIG. 9 is a manufacturing process diagram of a first part of a display module according to an embodiment.

FIG. 8 is a flowchart illustrating a manufacturing process of a first part of the display module according to an embodiment, and FIG. 9 is a manufacturing process diagram of a first part of the display module according to an embodiment. In FIG. 9, only the part corresponding to one pixel has been enlarged and illustrated rather than illustrating the whole first part 11 of the display module 10.

Referring to FIG. 8 and FIG. 9, the first part 11 of the display module 10 may be manufactured through the following order.

First, the UV cutoff filter 91 may be formed at one surface of the transparent cover layer 90 (S11). The UV cutoff filter 91 may block ultraviolet rays emitted from the first UV micro LED 61, the second UV micro LED 62, and the third UV micro LED 63.

A protection layer 93 may be formed, in a stacked manner, on the UV cutoff filter 91 to protect the UV cutoff filter 91 while manufacturing the first part 11 (S12).

Then, the black matrix 77 may be formed in grid form at another surface of the transparent cover layer 90 (S13).

The transparent cover layer 90 may include, for example, a quadrangle type or a rectangle type glass substrate having a predetermined thickness. The size of the transparent cover layer 90 may roughly correspond with the rough size of the TFT substrate 20.

Based on the black matrix 77 being formed in a grid shape, multiple cells may be formed, and the respective cells may become a sub pixel area. As described above, the color filters may be formed in a pre-set cell from among the multiple cells of the black matrix 77 (S14).

For example, to form the first color filter 81, a red material may be uniformly applied to the whole one surface of the transparent cover layer 90 on which the black matrix 77 is formed. Then, only the area where the red is to remain may be exposed using a mask and the red material may be removed from the remaining area through development.

Then, to form the second color filter 82, a green material may be uniformly applied to the whole one surface of the transparent cover layer 90. Then, only the area where the green is to remain may be exposed using a mask and the green material may be removed from the remaining area through development.

In addition, to form the transparent resin layer 83, a transparent resin material may be uniformly applied to the whole one surface of the transparent cover layer 90. Then, only the area where the transparent resin is to remain may be exposed using a mask and the transparent resin material may be removed from the remaining area through development.

As a method of applying the color filter material and the transparent resin material to the transparent cover layer 90, a slit method of using a printer nozzle to evenly apply to a whole surface, a spin method of applying by spraying a liquid to a center and rotating a plate, and the like may be applied.

Based on the first color filter 81, the second color filter 82, and the transparent resin layer 83 being formed, the planarization layer 75 may be formed, in a stacked manner, over the first color filter 81, the second color filter 82, and the transparent resin layer 83 (S15).

The top surface 75a of the planarization layer 75 may have a flatness to an extent that partition walls 70 can be formed at a uniform height. The planarization layer 75 may be formed of a transparent material which does not affect the transmittance, the reflectivity, and the refractive index of light.

Then, the partition walls 70 in the grid form may be formed at the top surface 75a of the planarization layer 75 (S16). The respective cells formed by the partition walls 70 may be formed at a position corresponding to the respective cells which is formed by the above-described black matrix 77. In this case, the respective cells formed by the partition walls 70 may correspond to the sub pixel area.

After the partition walls 70 are formed, the first color conversion layer 71, the second color conversion layer 72, and the third color conversion layer 73 may be sequentially patterned with a color conversion material (nanophosphor) in the respective cells through an inkjet printing method (S17).

As another method of forming the first color conversion layer 71, the second color conversion layer 72, and the third color conversion layer 73, the first color conversion layer 71, the second color conversion layer 72, and the third color conversion layer 73 may be formed by applying, exposing, and developing a photoresist which mixed the nanophosphor similarly with the manufacturing method of the above-described color filter.

The first color conversion layer 71 may be formed of the red nanophosphor which may emit light of the red wavelength range, and the second color conversion layer 72 may be formed of the green nanophosphor which may emit light of the green wavelength range. The third color conversion layer 73 may be formed of the blue nanophosphor which may emit light of the blue wavelength range.

Then, the protection layer 93 may be removed from the UV cutoff filter 91 (S18). Thereby, the first part 11 which forms a top plate of the display module 10 may be formed.

Figure 10:
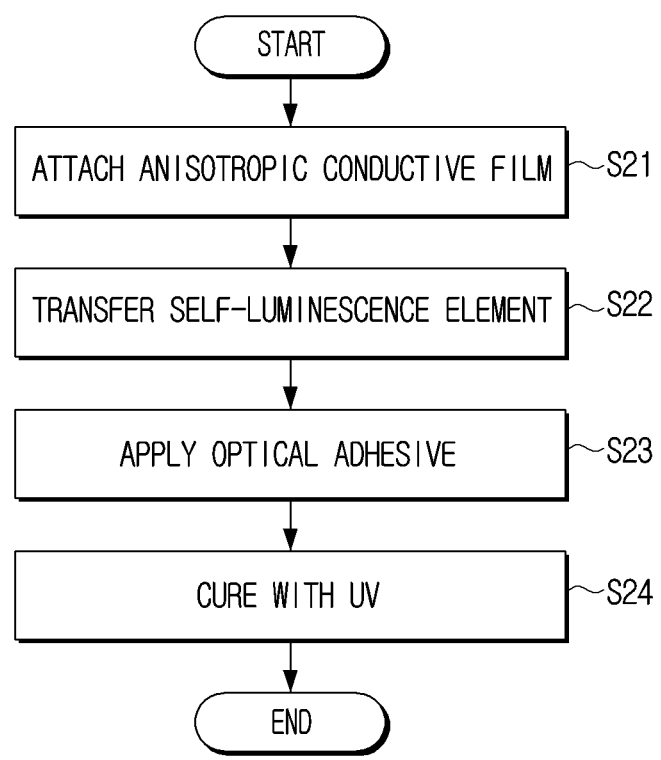
FIG. 10 is a flowchart illustrating a manufacturing process of a second part of a display module according to an embodiment.
Figure 11:
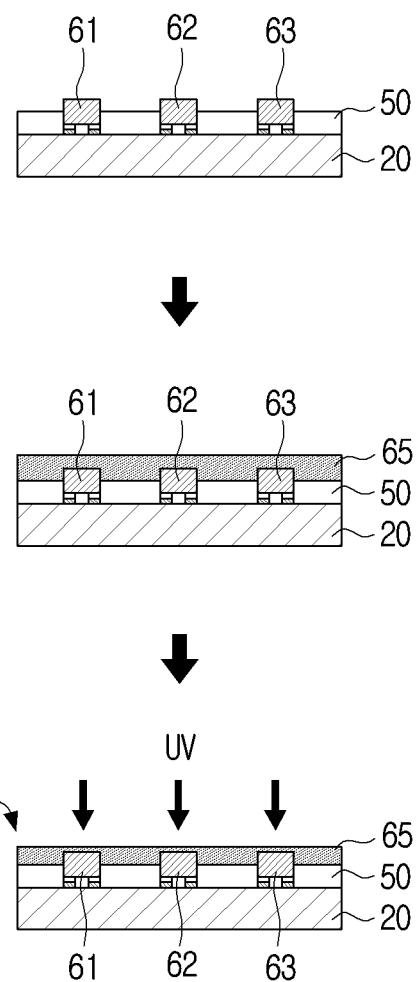
FIG. 11 is a manufacturing process diagram of a second part of a display module according to an embodiment.

FIG. 10 is a flowchart illustrating a manufacturing process of the second part 12 of the display module 10 according to an embodiment, FIG. 11 is a manufacturing process diagram of the second part 12 of the display module 10 according to an embodiment, and in FIG. 11, a part corresponding to one pixel has been enlarged and illustrated rather than illustrating the whole second part 12 of the display module 10.

Referring to FIG. 10 and FIG. 11, the anisotropic conductive film 50 may be laminated to the front surface of the TFT substrate 20 (S21). In this case, the first substrate electrode pad 26a and the second substrate electrode pad 26b (refer to FIG. 3) may be arranged spaced apart at a certain distance at the front surface of the TFT substrate 20.

After attaching the anisotropic conductive film 50 to the TFT substrate 20, multiple UV micro LEDs may be transferred to the TFT substrate 20 (S22).

The UV micro LED transferring process may be carried out through the laser transfer method, the rollable transfer method, the pick and place transfer method, and the like. In this case, the first UV micro LED 61, the second UV micro LED 62, and the third UV micro LED 63 may be transported from respective epi substrates to relay substrates (or interposer), and then transferred from the respective relay substrates to the TFT substrate 20 which is a target substrate.

When the first UV micro LED 61, the second UV micro LED 62, and the third UV micro LED 63 are transferred to the TFT substrate 20, the first UV micro LED 61, the second UV micro LED 62, and the third UV micro LED 63 may be positioned at a surface of the anisotropic conductive film 50 which is opposite to a surface of the anisotropic conductive film 50 that is attached to the TFT substrate. In this state, the first UV micro LED 61, the second UV micro LED 62, and the third UV micro LED 63 may be inserted inside the anisotropic conductive film 50 by a predetermined depth through the thermocompression process. Accordingly, the first UV micro LED 61, the second UV micro LED 62, and the third UV micro LED 63 may be physically fixed to the TFT substrate 20. In addition, chip electrodes of respective ones of the first UV micro LED 61, the second UV micro LED 62, and the third UV micro LED 63 may be electrically coupled by the corresponding substrate electrode pads and by multiple conductive balls 51 distributed in the anisotropic conductive film 50.

Then, the optical adhesive 65 for bonding the first part 11 and the second part 12 may be applied to the front surface of the TFT substrate 20 (S23).

The optical adhesive 65 may be applied to the TFT substrate 20 to cover all of the multiple ones of the first UV micro LED 61, the second UV micro LED 62, and the third UV micro LED 63. The optical adhesive 65 may be a UV curing silicon rubber (Di-methyl siloxane) having curing properties after a certain time after UV exposure.

Then, the optical adhesive 65 may be irradiated with UV for a pre-set time and cured (S24).

The second part 12 which forms a bottom plate of the display module 10 may be formed through the process as described above.

The process of manufacturing the display module 10 by bonding the first part 11 and the second part 12 together will be described below.

Figure 12:
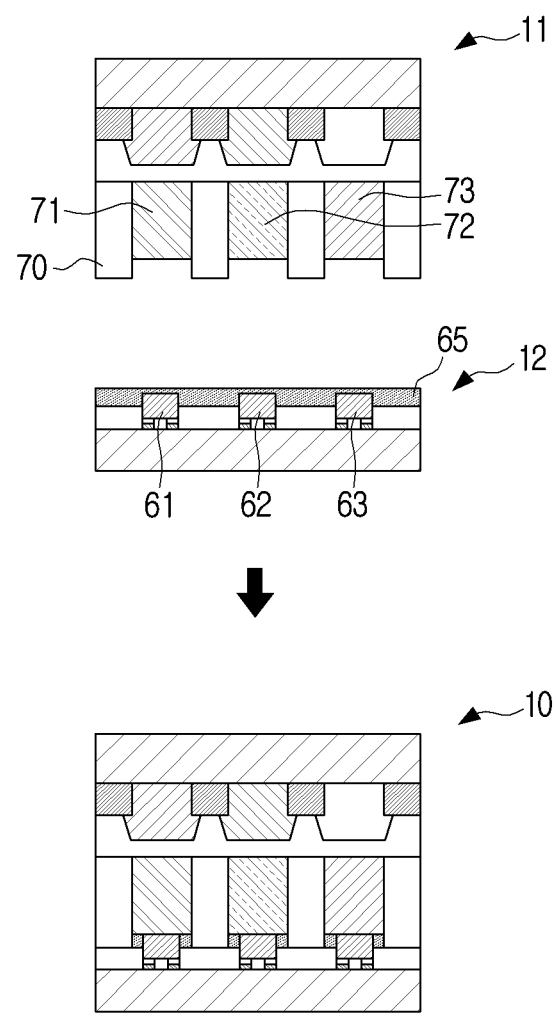
FIG. 12 is a manufacturing process diagram of coupling a first part with a second part of a display module according to an embodiment.

FIG. 12 is a manufacturing process diagram of coupling the first part with the second part of the display module according to an embodiment.

Referring to FIG. 12, after positioning the second part 12 in a die, the first part 11 may be disposed spaced apart by a predetermined distance to the top side of the second part 12.

Then, to bond the first part 11 and the second part 12 together, the first part 11 is reversed and the first color conversion layer 71, the second color conversion layer 72, and the third color conversion layer 73 of the first part 11 may be arranged to a bonding position to respectively correspond to the first UV micro LED 61, the second UV micro LED 62, and the third UV micro LED 63 of the second part 12.

In this case, according to embodiments, the first part 11 and the second part 12 may be arranged to be parallel with each other with respect to the same plane.

After the first part 11 and the second part 12 are arranged to the bonding position, the first part 11 may be closely contacted to the second part 12 with a pre-set pressure and the first part 11 and the second part 12 may be bonded. In this case, the first part 11 and the second part 12 may be bonded together by the optical adhesive 65.

After bonding the first part 11 and the second part 12, the bonding between the first part 11 and the second part 12 may be made firm by curing the optical adhesive 65.

The display module 10 according to an embodiment of the disclosure may be manufactured through the process described above.

In the above, various embodiments of the disclosure have been described respectively and individually, but the respective embodiments may not necessarily be implemented on its own, and the configuration and operation of the respective embodiment may be implemented in combination with at least one other embodiment.

It will be understood that the various example embodiments described in the disclosure are intended to be illustrative, not limiting. It will be understood by those skilled in the art that various changes in form and details may be made therein without departing from the true spirit and full scope of the disclosure, including the appended claims and their equivalents.

What is claimed is:

1. A display module, comprising:
    a substrate; and
    a plurality of pixels arranged on the substrate,
    wherein each pixel of the plurality of pixels comprises:
        a first self-luminescence element, a second self-luminescence element, and a third self-luminescence element that are configured to emit light of an ultraviolet wavelength range;
        a first color conversion layer, a second color conversion layer, and a third color conversion layer respectively corresponding to light emitting surfaces of the first self-luminescence element, the second self-luminescence element, and the third self-luminescence element;
        a first color filter and a second color filter respectively corresponding to the first color conversion layer and the second color conversion layer;
        a transparent resin layer corresponding to the third color conversion layer and disposed on a same plane as a plane at which the first color filter and the second color filter are positioned;
        a transparent cover layer that covers the first color filter, the second color filter, and the transparent resin layer; and
        an ultraviolet (UV) cutoff filter that covers the transparent cover layer,
    wherein areas of surfaces of the first color conversion layer, the second color conversion layer, and the third color conversion layer, that respectively face in a first direction toward the light emitting surfaces of the first self-luminescence element, the second self-luminescence element, and the third self-luminescence element, are respectively greater than areas of the light emitting surfaces of the first self-luminescence element, the second self-luminescence element, and the third self-luminescence element,
    wherein the first self-luminescence element, the second self-luminescence element, and the third self-luminescence element are separated from each other by partition walls,
    wherein each of the partition walls overlaps at least one from among the first self-luminescence element, the second self-luminescence element, and the third self-luminescence element in a second direction, that is perpendicular to the first direction, and further overlaps at least one from among the first color conversion layer, the second color conversion layer, and the third color conversion layer in the second direction, and
    wherein the partition walls are configured to reflect light emitted from side surfaces of the first color conversion layer, the second color conversion layer, and the third color conversion layer.

2. The display module of claim 1, wherein at least one of the partition walls comprises a white-based color.

3. The display module of claim 1, wherein at least one of the partition walls has a surface on which a metal film is formed.

4. The display module of claim 1, wherein the side surfaces of the first self-luminescence element, the second self-luminescence element, and the third self-luminescence element are respectively adhered to side surfaces of the partition walls by an optical adhesive.

5. The display module of claim 4, wherein portions of the surfaces of the first color conversion layer, the second color conversion layer, and the third color conversion layer that are respectively outwards from the light emitting surfaces of the first self-luminescence element, the second self-luminescence element, and the third self-luminescence element, in the second direction that is perpendicular to the first direction, are adhered with the optical adhesive, and
    the optical adhesive is a UV curing silicon rubber.

6. The display module of claim 1, wherein the first color conversion layer comprises a color conversion material that is configured to emit light of a red wavelength range,
    wherein the second color conversion layer comprises a color conversion material that is configured to emit light of a green wavelength range, and
    wherein the third color conversion layer comprises a color conversion material that is configured to emit light of a blue wavelength range.

7. The display module of claim 6, wherein the color conversion material of the first color conversion layer is a red nanophosphor,
    wherein the color conversion material of the second color conversion layer is a green nanophosphor, and
    wherein the color conversion material of the third color conversion layer is a blue nanophosphor.

8. The display module of claim 7, wherein the red nanophosphor is $Si_{1-x}Ca_xAlSiN_3:Eu^{2+}$.

9. The display module of claim 7, wherein the green nanophosphor is $Si_{6-z}Al_zO_zN_{8-z}:Eu^{2+}$ or $SrGa_2S_4$.

10. The display module of claim 7, wherein the blue nanophosphor is $BaMg_xAl_yO_z:Eu^{n+}$.

11. The display module of claim 7, wherein the red nanophosphor and the green nanophosphor are respectively configured with a particle size distribution median value d50 of less than 0.5 μm.

12. The display module of claim 6, wherein the color conversion material of the first color conversion layer comprises a red quantum dot,
    wherein the color conversion material of the second color conversion layer comprises a green quantum dot, and
    wherein the color conversion material of the third color conversion layer comprises a blue quantum dot.

13. The display module of claim 1, wherein a black matrix is formed between the first color filter, the second color filter, and the transparent resin layer.

14. The display module of claim 1, wherein the UV cutoff filter is configured with a transmittance of less than or equal to 10% based on a wavelength of less than or equal to 400 nm.

15. The display module of claim 1, wherein the UV cutoff filter comprises:
a transparent resin; and
UV absorbing particles which are mixed in the transparent resin,
wherein a material of the UV absorbing particle is TiO2 or SiO2, and a size distribution median value d50 of the UV absorbing particles is less than 0.2 μm.

16. The display module of claim 1, further comprising:
a plurality of substrate electrodes formed on the substrate; and
an anisotropic conductive film,
wherein chip electrodes of the first self-luminescence element, the second self-luminescence element, and the third self-luminescence element are electrically and physically coupled to the plurality of substrate electrodes by the anisotropic conductive film.

17. The display module of claim 1, wherein each pixel of the plurality of pixels further comprises a protection layer on the UV cutoff filter.

* * * * *